United States Patent
Yoo et al.

(10) Patent No.: US 10,115,635 B2
(45) Date of Patent: Oct. 30, 2018

(54) METHOD FOR FILLING A WAFER VIA WITH SOLDER

(71) Applicant: KOREA INSTITUTE OF INDUSTRIAL TECHNOLOGY, Cheonan (KR)

(72) Inventors: Sehoon Yoo, Incheon (KR); Chang Woo Lee, Anyang (KR); Jun Ki Kim, Gunpo (KR); Jeong Han Kim, Seoul (KR); Young Ki Ko, Incheon (KR)

(73) Assignee: KOREA INSTITUTE OF INDUSTRIAL TECHNOLOGY, Cheonan (KR)

( * ) Notice: Subject to any disclaimer, the term of this patent is extended or adjusted under 35 U.S.C. 154(b) by 42 days.

(21) Appl. No.: 15/423,602

(22) Filed: Feb. 3, 2017

(65) Prior Publication Data

US 2017/0148678 A1    May 25, 2017

Related U.S. Application Data

(62) Division of application No. 14/129,076, filed as application No. PCT/KR2012/005440 on Jul. 10, 2012, now Pat. No. 9,603,254.

(30) Foreign Application Priority Data

Jul. 10, 2012 (CN) .................. 10-2011-0068845

(51) Int. Cl.
*B23K 1/00* (2006.01)
*H01L 21/768* (2006.01)
*H01L 23/48* (2006.01)
*B23K 3/06* (2006.01)
*B23K 1/20* (2006.01)
*B23K 3/08* (2006.01)
*B23K 101/40* (2006.01)

(52) U.S. Cl.
CPC ...... *H01L 21/76898* (2013.01); *B23K 1/0016* (2013.01); *B23K 1/20* (2013.01); *B23K 3/06* (2013.01); *B23K 3/0646* (2013.01); *B23K 3/087* (2013.01); *H01L 23/481* (2013.01); *B23K 2101/40* (2018.08)

(58) Field of Classification Search
CPC ... B23K 1/0016; B23K 3/06; H01L 21/76898; H01L 23/481
See application file for complete search history.

(56) References Cited

U.S. PATENT DOCUMENTS 7,300,857 B2 * 11/2007 Akram ............... H01L 21/6835
                                                                257/621
7,749,899 B2 *  7/2010 Clark ................ H01L 21/76898
                                                             257/E21.585

* cited by examiner

*Primary Examiner* — Carl Arbes
(74) *Attorney, Agent, or Firm* — Cantor Colburn LLP

(57) ABSTRACT

A wafer via solder filling device includes a solder bath comprising an accommodation space for accommodating a molten solder, with an open top, and an air outlet for exhausting air from the accommodation space; a fixing unit for fixing the wafer having a via formed in one surface in the accommodation space to seal the accommodation space airtight; and a pressing unit for pressing a bottom of the molten solder arranged in the solder bath and moving the molten solder upward, to fill the molten solder in the via.

2 Claims, 5 Drawing Sheets

[FIG.1]
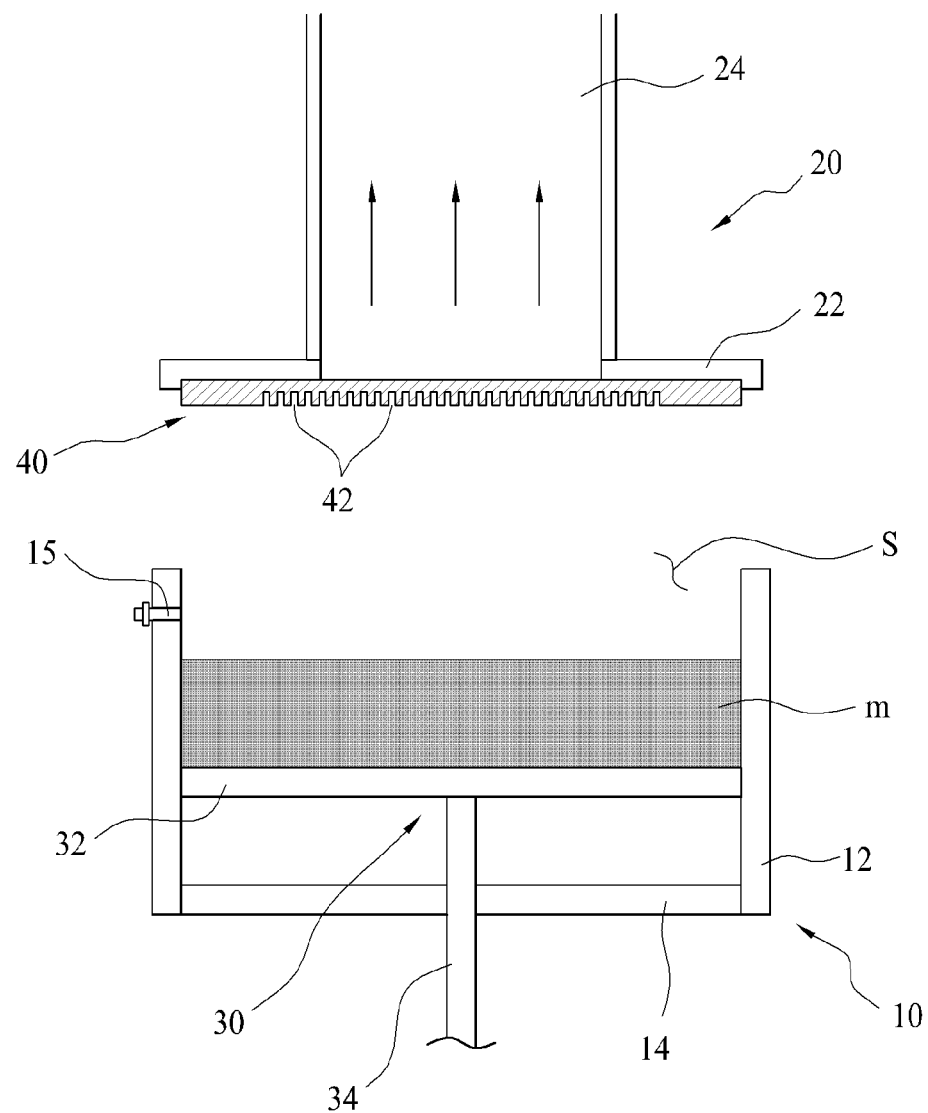

[FIG.2]
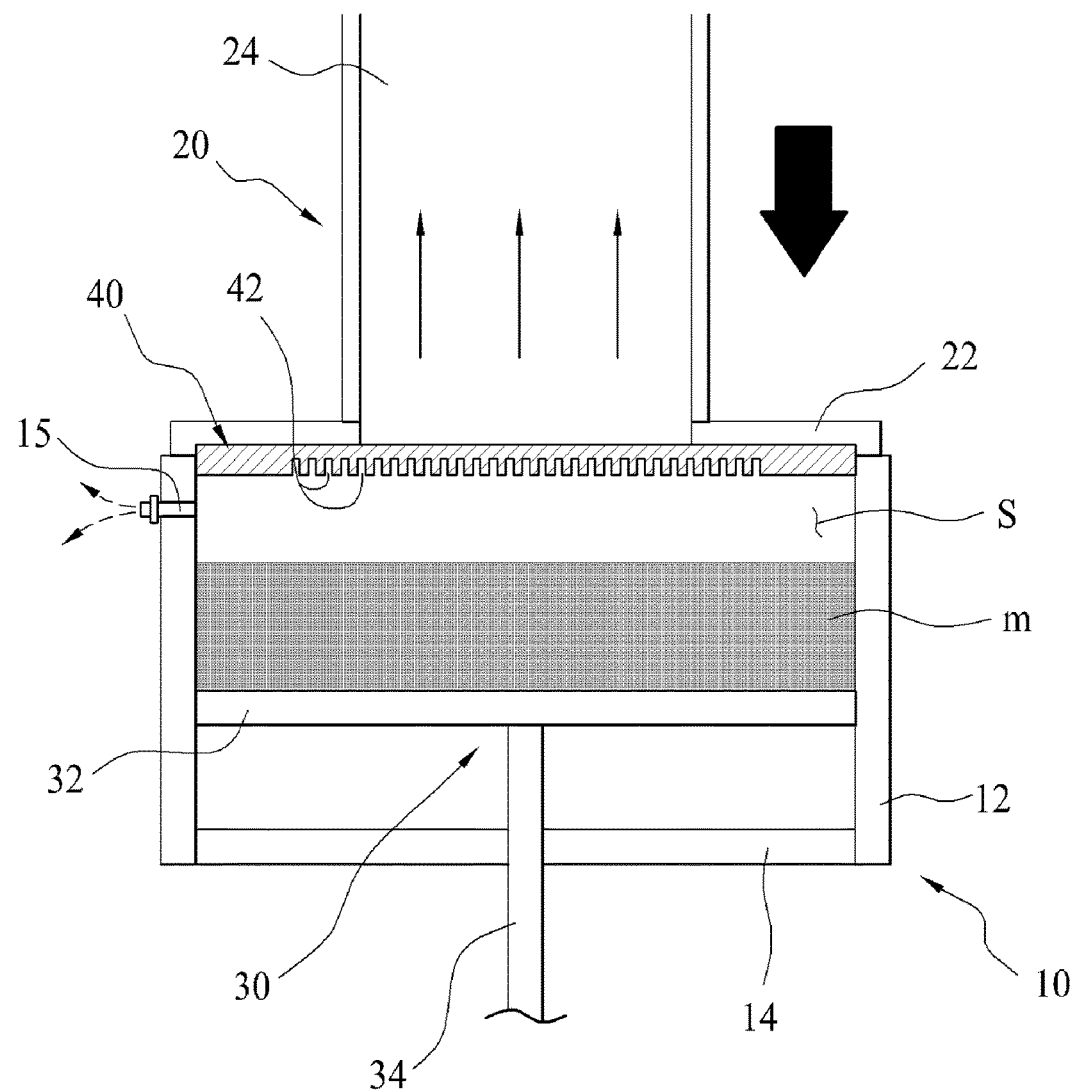

[FIG.3]
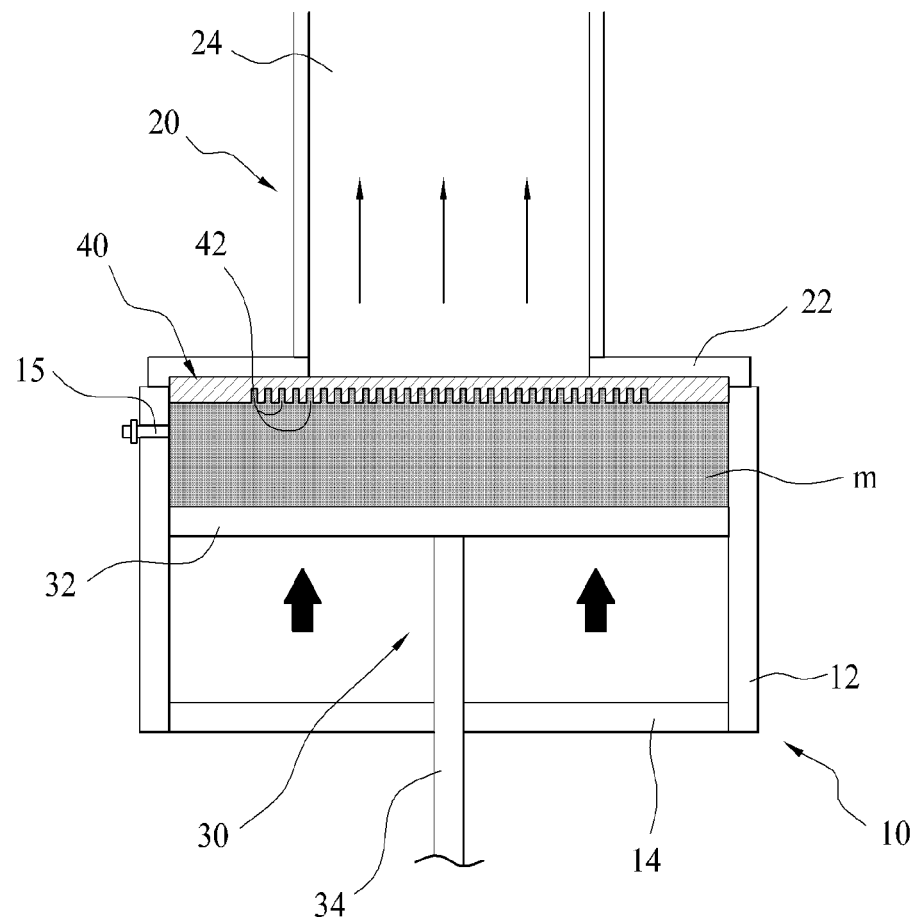
[FIG.4]
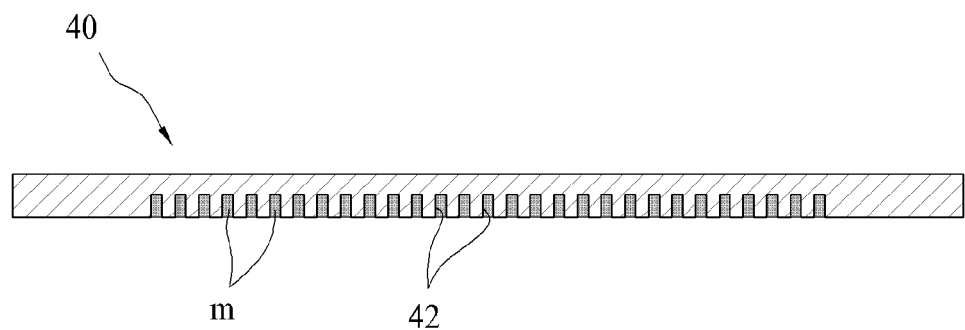

[FIG.5]
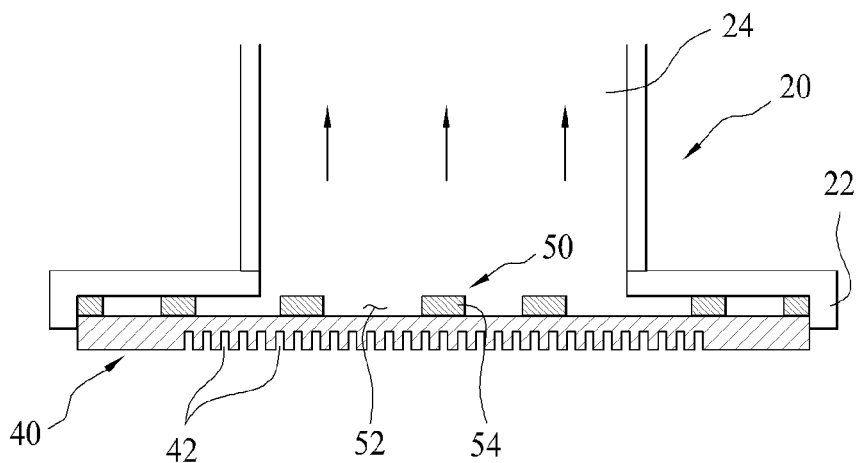
[FIG.6]
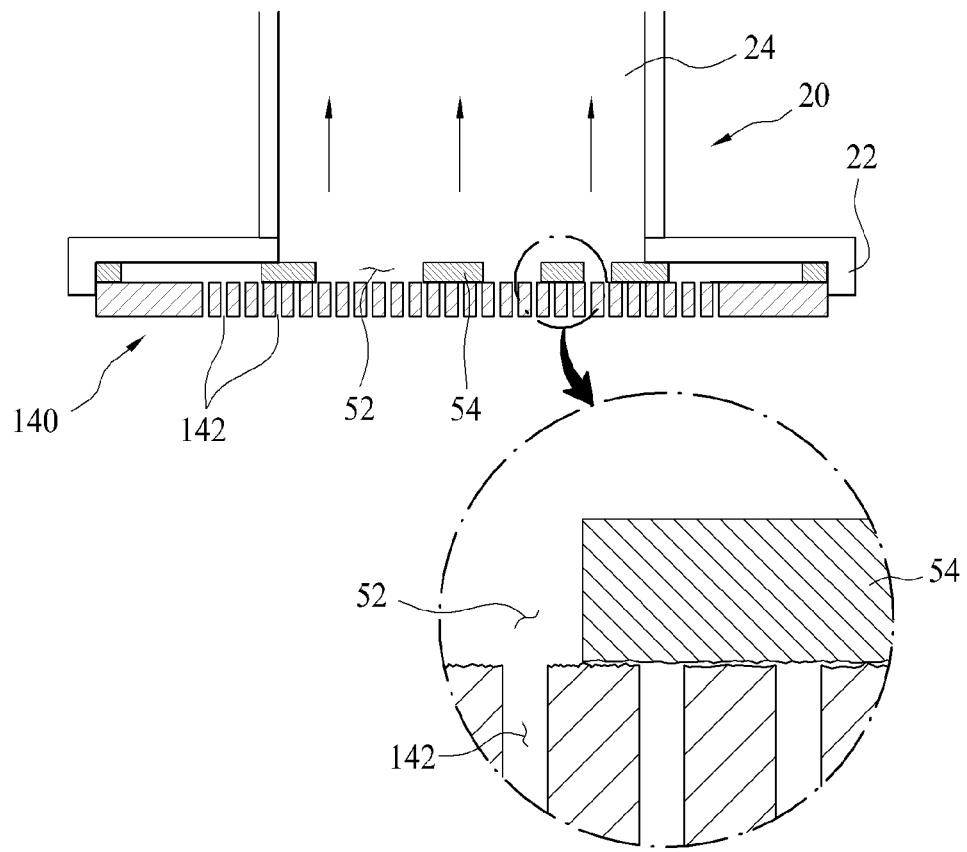

[FIG.7]
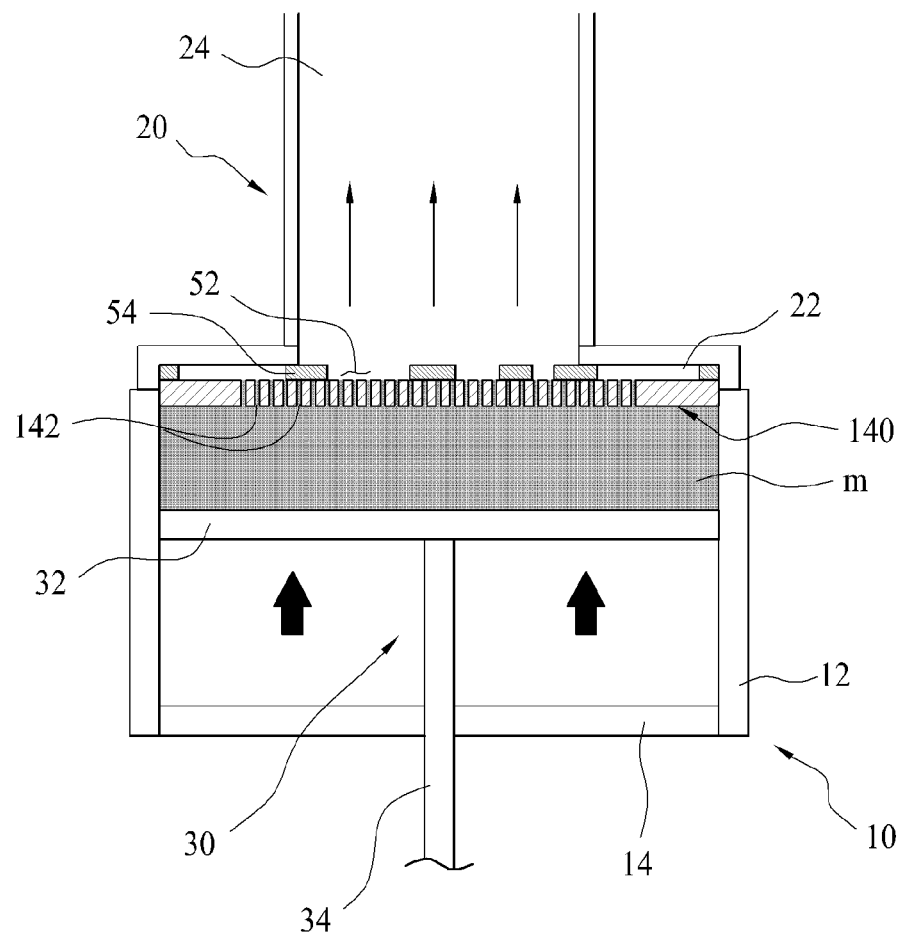
[FIG.8]
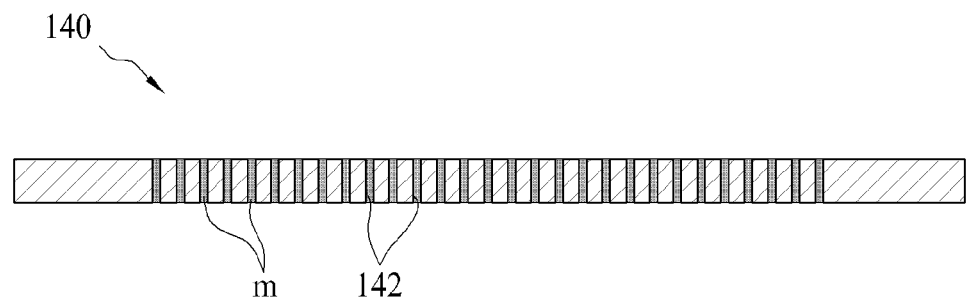

METHOD FOR FILLING A WAFER VIA WITH SOLDER

CROSS-REFERENCE TO PRIOR APPLICATIONS

This application is a divisional application of U.S. patent application Ser. No. 14/129,076, filed on Dec. 23, 2013, which is a national Stage Patent Application of PCT International Patent Application No. PCT/KR2012/005440, filed on Jul. 10, 2012 under 35 U.S.C. § 371, which claims priority of Korean Patent Application No. 10-2011-0068845, filed on Jul. 12, 2011, which are all hereby incorporated by reference in their entirety.

BACKGROUND OF THE DISCLOSURE

Field of the Disclosure

The present invention relates to a wafer via solder filling device for filling solder in a via formed in a wafer, more particularly, to a wafer via solder filling device including a pressing unit for pressing and moving a molten solder upward.

Discussion of the Related Art

As electronic devices are getting small-sized recently, semiconductor packages used in electronic devices tend to be small-sized. Especially, a plurality of vias may be formed in a wafer to reduce a volume of wafers disposed in layers. Copper is filled in the via in a process of electroplating and wafers are disposed in 3-dimentional, such that wafers may be electrically connected. A method of filling a molten solder in a via, not copper, is recently introduced.

Specifically, when a molten solder is filling in a via of a wafer in prior art, a method for simply exposing a via to a molten solder or a method of melting a solder electroplated on an internal wall of a via is conventionally used.

In case of using such methods, a molten solder could not be filling in the via completely and a void or crack might occur frequently, which could cause a high error rate of wafers.

Moreover, the wafer having the via formed in only one of upper and lower surfaces is provided or the wafer having the via formed through vertically is provided. However, the same filling process is performed, regardless of the via type formed in the wafer. Accordingly, there is a disadvantage of high quality variation in products.

Accordingly, methods for solving such disadvantages are required.

SUMMARY OF THE DISCLOSURE

Accordingly, the embodiments may be directed to a wafer via solder filling device including a pressing unit to prevent void or a crack generated by the molten solder failed to filling in a via of a solder, and a wafer via solder filling method using the same.

To achieve these objects and other advantages and in accordance with the purpose of the embodiments, as embodied and broadly described herein, a wafer via solder filling device includes a solder bath comprising an accommodation space for accommodating a molten solder, with an open top, and an air outlet for exhausting air from the accommodation space; a fixing unit for fixing the wafer having a via formed in one surface in the accommodation space to seal the accommodation space airtight; and a pressing unit for pressing a bottom of the molten solder arranged in the solder bath and moving the molten solder upward, to fill the molten solder in the via.

The pressing unit may include a pressing board provided in the solder bath, with a predetermined area corresponding to the accommodation space, to transfer the molten solder arranged in the solder bath; and a pressing cylinder connected to the pressing board through a bottom of the solder bath to drive the pressing board vertically.

A heating portion may be provided in one or more of the solder bath and the pressing unit to prevent the molten solder from being hardened by providing heat to the molten solder arranged in the solder bath.

In another aspect, a wafer via solder filling device includes a solder bath comprising an accommodation space for accommodating a molten solder, with an open top; a fixing unit for providing a suction force to a top surface of a wafer having a via vertically there through and fixing the wafer in the accommodation space; and a pressing unit for pressing a bottom of the molten solder arranged in the solder bath and moving the molten solder upward, to fill the molten solder in the via.

The wafer via solder filling device may further include a porous plate provided between the top surface of the wafer and the fixing unit, the porous plate comprising a plurality of through-holes formed vertically, to prevent the wafer from being bent by the suction force provided from the fixing unit.

The pressing unit the pressing unit may include a pressing board provided in the solder bath, with a predetermined area corresponding to the accommodation space, to transfer the molten solder arranged in the solder bath; and a pressing cylinder connected to the pressing board through a bottom of the solder bath to drive the pressing board vertically.

A heating portion may be provided in one or more of the solder bath and the pressing unit to prevent the molten solder from being hardened by providing heat to the molten solder arranged in the solder bath.

In a further aspect, a wafer via solder filling method using a wafer via solder filling device comprising a solder bath comprising an accommodation space for accommodating a molten solder, with an open top, and an air outlet for exhausting air from the accommodation space; a fixing unit for fixing the wafer having a via formed in one surface in the accommodation space to seal the accommodation space airtight; and a pressing unit for pressing a bottom of the molten solder arranged in the solder bath and moving the molten solder upward, to fill the molten solder in the via, the wafer via solder filling method includes a fixing step of fixing the wafer in the accommodation space, using the fixing unit, and sealing the accommodation space airtight; an exhausting step of exhausting air inside the sealed accommodation space through the air outlet; and a filling step of filling the molten solder in the via as pressing the bottom of the molten solder and moving the molten solder upward, using the pressing unit.

In a still further aspect, a wafer via solder filling method using a wafer via solder filling device comprising a solder bath comprising an accommodation space for accommodating a molten solder, with an open top; a fixing unit for providing a suction force to a top surface of a wafer having a via vertically there through and fixing the wafer in the accommodation space; and a pressing unit for pressing a bottom of the molten solder arranged in the solder bath and moving the molten solder upward, to fill the molten solder in the via, the wafer via solder filling method includes a fixing step of fixing the wafer in the accommodation space, using the fixing unit; and a filling step of filling the molten solder in the via by providing a suction force to a top surface of the wafer as pressing a bottom of the motel solder and moving the molten solder upward simultaneously, using the pressing unit.

Accordingly, the wafer via solder filling device including the pressing unit and the wafer via solder filling method have following effects, First of all, the molten solder may be filled in the via by the pressing of the pressing unit completely.

Furthermore, proper solder filling devices and solder filling methods may be provided according to the type of the via provided in the wafer.

Still further, when the via of the wafer is a vertically through type, the molten solder may be filled in the via of the wafer by the pressing of the pressing unit together with the suction force provided to the wafer.

Still further, when the porous plate is further provided, the shape of the wafer may be prevented from being deformed.

It is to be understood that both the foregoing general description and the following detailed description of the embodiments or arrangements are exemplary and explanatory and are intended to provide further explanation of the embodiments as claimed.

BRIEF DESCRIPTION OF THE DRAWINGS

Arrangements and embodiments may be described in detail with reference to the following drawings in which like reference numerals refer to like elements and wherein:

FIG. 1 is a sectional diagram illustrating an overall appearance of a wafer via solder filling device including a pressing unit according to a first embodiment of the disclosure;

FIG. 2 is a sectional diagram illustrating a wafer fixed to a solder bath in the wafer via solder filling device including the pressing unit according to the first embodiment of the disclosure;

FIG. 3 is a sectional diagram illustrating a molten solder filled in the via of the wafer as a molten solder is moving upward to the pressing unit in the wafer via solder filling device according to the first embodiment of the disclosure;

FIG. 4 is a sectional diagram illustrating a wafer fabricated, using the wafer via solder filling device including the pressing unit according to the first embodiment of the closure;

FIG. 5 is a sectional diagram illustrating a porous plate provided between an upper surface of a wafer and a fixing unit provided in a wafer via solder filling device including the pressing unit according to a second embodiment of the closure;

FIG. 6 is a sectional diagram illustrating a wafer having a vertically-through-hole type via and a porous plate to a fixing unit in a wafer via solder filling device including a pressing unit according to a third embodiment of the closure;

FIG. 7 is a sectional diagram illustrating a wafer fixed to a solder bath in the wafer via solder filling device including the pressing unit according to the third embodiment of the closure; and FIG. 8 is a sectional diagram illustrating a wafer fabricated, using the wafer via solder filling device including the pressing unit according to the third embodiment of the closure.

DESCRIPTION OF SPECIFIC EMBODIMENTS

Reference may now be made in detail to specific embodiments, examples of which may be illustrated in the accompanying drawings. Wherever possible, same reference numbers may be used throughout the drawings to refer to the same or like parts. Specific embodiments will be explained in the drawings and the detailed description. However, it is to be understood that the invention is not limited in its application to the details of constriction and the arrangement of components set forth in the following description or illustrated in the following drawings. Reference may now be made in detail to specific embodiments, examples of which may be illustrated in the accompanying drawings. Wherever possible, same reference numbers may be used throughout the drawings to refer to the same or like parts.

A wafer via solder filling device according to exemplary embodiments of the present disclosure includes a solder bath for accommodating a molten solder, a fixing unit for fixing a wafer and a pressing unit for moving the molten solder upward.

Specifically, the solder bath has an accommodating space formed therein, with an open top, and the molten solder may be mounted in the accommodating space. When a via formed in the wafer is vertically through the wafer, an air outlet may be further provided in a predetermined portion of the solder bath to exhaust internal air of the accommodation space outside, which will be described in detail later.

The fixing unit fixes the wafer having the via in the accommodation space. At this time, various methods of fixing the wafer in the accommodation unit may be used. Typically, a method of suckingly fixing the wafer by providing a sucking force to a top surface of the wafer is used most broadly. It is obvious for the fixing unit to transfer the wafer as well as to fix the wafer.

When the via formed in the wafer is provided only to one surface of the wafer, it is necessary for the fixing unit to fix the wafer so as to close the accommodation space airtight, which will be described in detail later.

The pressing unit is configured to press a bottom of the molten solder and move the molten solder mounted in the solder bath upward, such that the molten solder can fill in the via.

As mentioned in the related art, the method of exposing the via of the wafer to the molten solder simply or the method of melting the solder electroplated on an internal surface of the via is usually used in such the filling process. Accordingly, the molten solder might be filled in the via completely or voids or cracks might generated frequently.

However, the pressing unit is provided in the wafer via solder filling device according to the embodiments of the disclosure and the pressing unit presses the molten solder only to fill the molten solder in the via completely. The pressing unit may have various types.

Meanwhile, different solder filling methods may be used based on which type is used out of a wafer having a via formed only in one surface or a wafer having a vertically-through hole type via.

More specifically, when the via is formed only in one surface of the wafer, not through the wafer, the via is exposed to both surfaces of the wafer through an auxiliary wafer etching process after the filling process. When the via is vertically through the wafer, no auxiliary wafer etching process is performed. In other words, the same wafer having the via vertically exposed may be fabricated accordingly. When performing the filling process, it is necessary to perform an appropriate solder filling method for each of the wafers having the different type vias.

In the conventional wafer via solder filling device, the same filling process is performed, regardless of the via type formed in the wafer. Accordingly, the conventional wafer via solder filling device has a disadvantage of high quality variation.

The components and the related art of the wafer via solder filling device according to the embodiments of the disclosure are schematically described. Hereinafter, they will be described according to each of the embodiments in detail.

First of all, FIG. 1 illustrates an overall appearance of a wafer via solder filling device including a pressing unit according to a first embodiment. As shown in FIG. 1, a solder bath 10 including a lateral wall 12 and a bottom 14 is provided in the wafer via solder filling device and an accommodation space (S) is formed in the solder bath 10 and a molten solder (m) is filled in the accommodation space (S).

Hence, a fixing unit 20 is positioned on the solder bath 10. Specifically, the fixing unit 20 includes a fixing portion 22 which the wafer 40 contacts with and a suction path 24 formed in a center thereof, provided with a suction force to fixedly suck the wafer 40. In other words, the fixing unit 20 provides a suction force to a top surface of the wafer 40 to fix the wafer 40 to the fixing portion 22.

At this time, the wafer 40 according to this embodiment has the via 42 formed only in one surface. When the wafer 40 is fixed to the fixing unit 20, the via 42 faces downward to make the via 42 exposed to the molten solder (m) arranged in the accommodation space (S).

Hence, the pressing unit 30 penetrates the solder bath 10 to push the molten solder (m) upward effectively. Specifically, the pressing unit 30 includes a pressing board 32 in the solder bath 10, with a predetermined area corresponding to the accommodation space (S), to transfer the molten solder (m) mounted in the solder bath 10; and a pressing cylinder 34 connected to the pressing board 32 through a lower portion of the solder bath 10, to drive the pressing board 32 vertically.

In other words, the pressing cylinder 34 is driven in a vertical direction manually or automatically, such that the pressing board 32 can move the molten solder (m) in a vertical direction. The pressing board 32 has to make the molten solder (m) not leak downward and a sealing member having a sealing effect (e.g., rubber) may be provided around the pressing board 32. Alternatively, the pressing board 32 may be formed of a predetermined material having a sealing effect.

Additionally, a heating portion may be further provided in one or more of the solder bath 10 and the pressing unit 30. The heating portion may provide heat to the molten solder (m) mounted in the solder bath 10 to prevent the molten solder (m) from being hardened. In other words, the heating portion is heating the molten solder (m) continuously and allows the molten solder (m) maintain a liquid state. Especially, in this embodiment, it is preferred that the heating portion is provided one or more of the lateral wall 12 of the solder bath 10 and the pressing board 32 of the pressing unit 30.

In this embodiment, an air outlet 15 is provided in a predetermined portion of the solder bath 10 to exhaust air from the accommodation space (s). The air outlet 15 is an essential element in case the wafer 40 used in the filling process has the via 42 formed only in one surface thereof. The air outlet 15 may be a valve type, which will be described together with description of a solder filling method later.

In a solder filling method using the solder filling device according to this embodiment, a fixing step of fixing the wafer 40 in the accommodation space (S), using the fixing unit 20, and sealing the accommodation space (S) airtight may be performed. The fixing step is shown in FIGS. 1 and 2. Referring to FIGS. 1 and 2, the fixing unit 20 moves downward in a state of suckingly fixing the wafer 40 thereto and then seat the wafer 40 on the accommodation space (S) of the solder bath 10. Especially, the accommodation space (S) has to be sealed airtight and effective filling can be enabled after that.

After that, an exhausting step of exhausting air from the sealed accommodation space (S) through the air outlet 15 is performed. The reason why the exhausting step is performed is that it is difficult to move the pressing unit 30 through the air inside the accommodation space (S) sealed in the fixing step and that the air inside the via 42 makes the molten solder (m) not filling in the via completely. In other words, when the via 42 is formed only in one surface of the wafer 40 according to this embodiment, it is necessary to eliminate the air inside the sealed accommodation space (S).

Hence, a filling step of filling the molten solder (m) in the via 42 as pressing the bottom of the molten solder (m) and moving the molten solder (m) upward, using the pressing unit 30, may be performed. This step is shown in FIG. 3. Referring to FIG. 3, the pressing cylinder 34 is moving upward and the pressing board 32 is moving the molten solder (m) upward, such that the molten solder (m) can be filling in the via 42 by the pressure completely.

In this embodiment, an internal space of the via 42 has to be also vacuum by the exhausting step. Accordingly, the molten solder (m) is filled in the via 42 completely by the pressing of the pressing unit 30.

FIG. 4 shows the wafer 40 having the via 42 filled with the molten solder (m) through the steps mentioned above. As shown in FIG. 4, the via 42 is filled with the molten solder (m) completely and the molten solder (m) is hardened to perform following processes.

Hereinafter, a second embodiment will be described. Referring to FIG. 5, the second embodiment of the disclosure is entirely the same as the first embodiment mentioned above, except a porous plate 50 further provided between a top surface of the wafer 40 and the fixing unit 20.

The porous plate 50 includes a plurality of through-holes 52 formed vertically. The porous plate 50 may be provided in contact with the top surface of the wafer 40 to prevent the wafer 40 from being bent by the suction force provided from the fixing unit 20. The other portion of the through-holes 52 may be a supporting portion 54 in the porous plate 40.

It is preferred that an entire area of the through-holes 52 occupies more than the other area to transfer the suction force provided from the fixing unit 20 to the wafer 40 sufficiently. The porous plate 50 has to prevent the bending of the wafer 40 and the supporting portion 54 has to secure strength over certain level. Accordingly, a rate of the area of the through-holes 52 to the area of the supporting portion 54 has to be considered properly.

In this embodiment, the porous plate 50 may be a honeycomb type such that the suction force can be transferred to the wafer 40 sufficiently, together with a proper supporting force.

Hereinafter, a third embodiment of the disclosure will be described. Referring to FIGS. 6 and 7, the third embodiment is entirely the same as the second embodiment mentioned above, except a via 142 vertically through the wafer 140 and no air outlet 15 formed in a solder bath 10.

The via 142 is formed through the wafer 140. Even though the wafer 140 is fixed in the accommodation space (S) of the solder bath 10, the accommodation space (S) is not sealed airtight. Accordingly, the solder filing method using the solder filling device according to this embodiment includes no exhausting step after the fixing step, different from the first or second embodiment.

In this embodiment, the suction force provided from the fixing unit 20 affects the molten solder (m), rather than the pressing provided from the pressing unit 30, which is different from the first or second embodiment. That is because the via 142 is formed through the wafer 140 vertically.

Specifically, when the via 142 is vertically through the wafer 140, the pressing effect of the pressing unit 30 could be reduced in comparison to the pressing effect when the accommodation space (S) of the solder bath 10 is sealed airtight. In this instance, the suction force provided from the fixing unit 20 may be worked together with the pressing force, such that an effective filling process can be performed.

Typically, a pitch of the via 142 formed in the wafer 140 is 20 μm and the pitch is quite minute. It is difficult to fill the molten solder (m) in the via having such the minute pitch effectively, using only one of the pressing provided from the pressing unit 30 and the suction force provided from the fixing unit 20.

In this embodiment, both the pressing of the pressing unit 30 and the suction of the fixing unit 20 may be provided simultaneously, so as to fill the molten solder (m) in the via 142 completely.

Meanwhile, a porous plate 52 may be provided in this embodiment and a pitch of the supporting portion 54 may be 300~400 μm. The pitch of the porous plate 52 is larger than the pitch of the via 142. The via 142 might be partially positioned in the supporting portion 54, not the through-holes 52, such that the suction force of the fixing unit 20 cannot affect the entire portion of the porous plate 50 disadvantageously.

However, the pitch of the via 142 is 20 μm and the pitch of the supporting portion 54 is approximately 300~400 μm as mentioned above, and the pitches are minute. Accordingly, when the pitches are increased by a micro unit shown in a lower area of FIG. 6, the contacting surface between the via 142 and the supporting portion 54 could be uneven and a minute aperture might be formed substantially. Accordingly, the suction force of the fixing unit 20 affects even the via 142 in contact with the supporting portion 54 such that the entire via 142 of the fixing unit 20may be filled with the molten solder (m).

FIG. 8 shows that the via 142 of the wafer 140 is filled with the molten solder through the steps. As shown in FIG. 8, the molten solder (m) is filled in the vertically through via 42 and hardened before following processes are performed.

The embodiments are described and according to the embodiments of the present disclosure, the molten solder may be filled in the via of the wafer by the pressing of the pressing unit completely. Also, the method of the solder filling method proper to the type of the wafer may be provided.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A wafer via solder filling method using a wafer via solder filling device comprising a solder bath comprising an accommodation space for accommodating a molten solder, with an open top, and an air outlet for exhausting air from the accommodation space; a fixing unit for fixing the wafer having a via formed in one surface in the accommodation space to seal the accommodation space airtight; and a pressing unit for pressing a bottom of the molten solder arranged in the solder bath and moving the molten solder upward, to fill the molten solder in the via, the wafer via solder filling method comprising:
   a fixing step of fixing the wafer in the accommodation space, using the fixing unit, and sealing the accommodation space airtight;
   an exhausting step of exhausting air inside the sealed accommodation space through the air outlet; and
   a filling step of filling the molten solder in the via as pressing the bottom of the molten solder and moving the molten solder upward, using the pressing unit.

2. A wafer via solder filling method using a wafer via solder filling device comprising a solder bath comprising an accommodation space for accommodating a molten solder, with an open top; a fixing unit for providing a suction force to a top surface of a wafer having a via vertically there through and fixing the wafer in the accommodation space; and a pressing unit for pressing a bottom of the molten solder arranged in the solder bath and moving the molten solder upward, to fill the molten solder in the via, the wafer via solder filling method comprising:
   a fixing step of fixing the wafer in the accommodation space, using the fixing unit; and
   a filling step of filling the molten solder in the via by providing a suction force to a top surface of the wafer as pressing a bottom of the motel solder and moving the molten solder upward simultaneously, using the pressing unit.

* * * * *